(12) United States Patent
Syroiezhin et al.

(10) Patent No.: US 10,680,599 B1
(45) Date of Patent: Jun. 9, 2020

(54) RF SWITCH WITH COMPENSATION

(71) Applicant: Infineon Technologies AG, Neubiberg (DE)

(72) Inventors: Semen Syroiezhin, Erlangen (DE); Pablo Araujo Do Nascimento, Munich (DE); Winfried Bakalski, Putzbrunn (DE); Andrea Cattaneo, Taufkirchen (DE); Jochen Essel, Munich (DE); Oguzhan Oezdamar, Brunnthal (DE); Johannes Klaus Rimmelspacher, Munich (DE); Valentyn Solomko, Munich (DE); Danial Tayari, Unterhaching (DE); Andreas Wickmann, Nuremberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/374,139

(22) Filed: Apr. 3, 2019

(51) Int. Cl.
*H03K 17/56* (2006.01)
*G05F 1/10* (2006.01)
*H03K 17/16* (2006.01)

(52) U.S. Cl.
CPC ............ *H03K 17/162* (2013.01); *G05F 1/10* (2013.01); *H03K 17/56* (2013.01)

(58) Field of Classification Search
CPC .... H03K 17/162; H03K 17/302; H03K 17/60; H03K 17/687; H03K 17/30; H03K 17/165; G05F 17/162; G05F 1/10
See application file for complete search history.

(56) References Cited

U.S. PATENT DOCUMENTS

| | | | |
|---|---|---|---|
| 9,331,690 B2 * | 5/2016 | Choi | H03K 17/693 |
| 10,056,895 B2 * | 8/2018 | Granger-Jones | H03K 17/102 |
| 10,284,200 B2 * | 5/2019 | Roy | H03K 19/0005 |
| 2019/0013806 A1 | 1/2019 | Solomko et al. | |

* cited by examiner

*Primary Examiner* — Dinh T Le
(74) *Attorney, Agent, or Firm* — Slater Matsil, LLP

(57) ABSTRACT

A radio frequency switch includes a first transistor and a second transistor coupled together to establish a switchable RF path, and a first compensation network coupled between the body terminal of the first transistor and the drain terminal of the second transistor, wherein the first compensation network establishes a path for current flowing between the body terminal of the first transistor and the drain terminal of the second transistor in a first direction and blocks current flowing in a second direction opposite to the first direction.

21 Claims, 17 Drawing Sheets

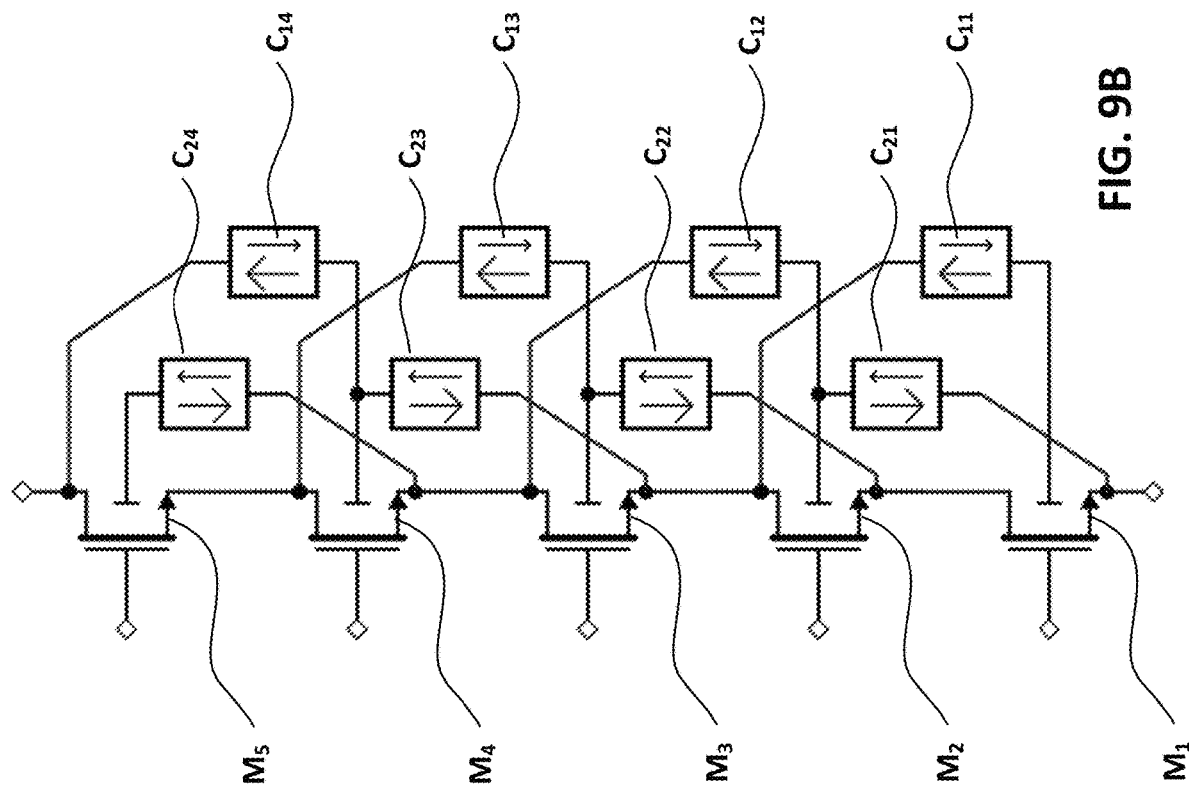

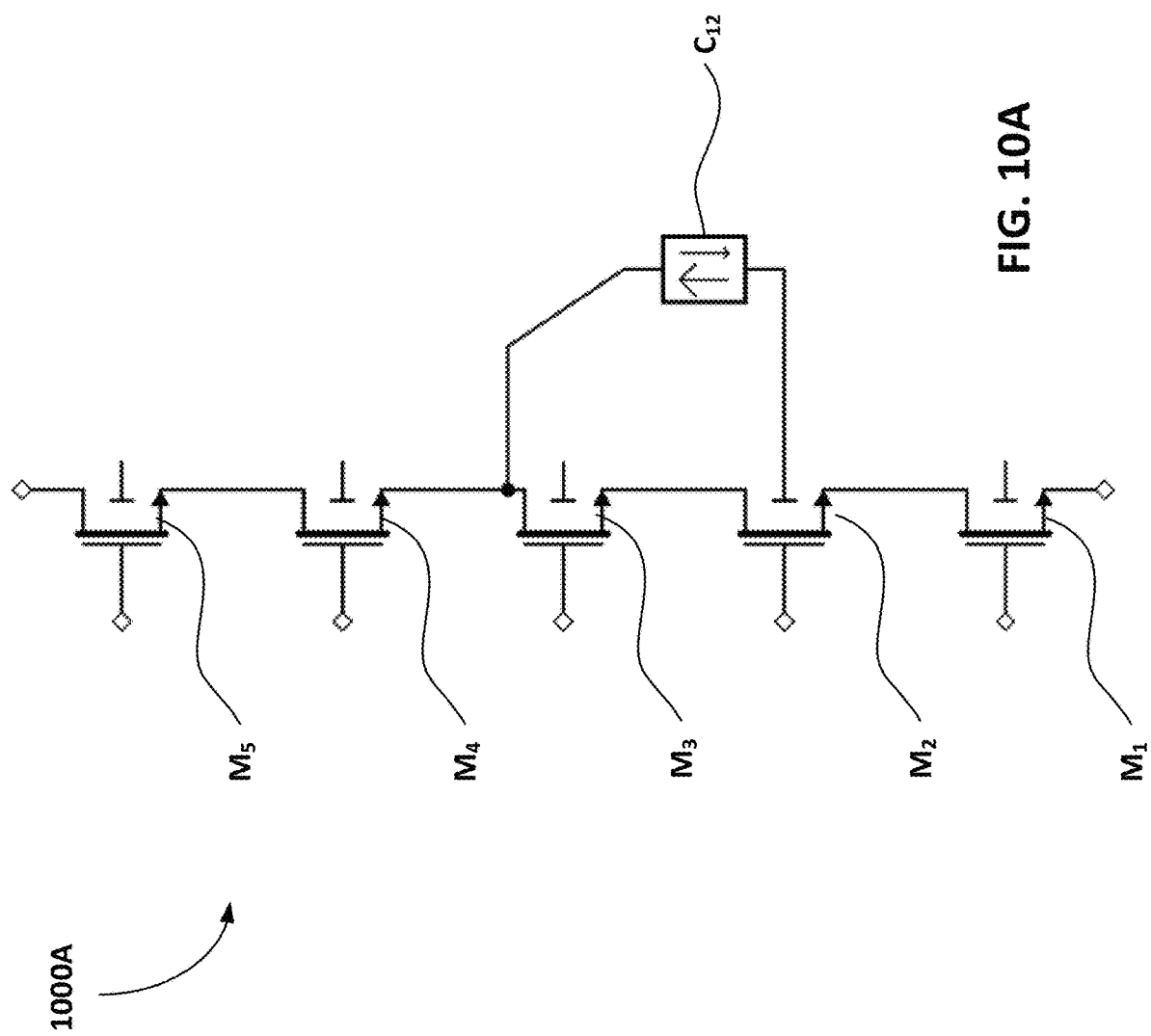

US 10,680,599 B1

RF SWITCH WITH COMPENSATION

TECHNICAL FIELD

The present invention relates generally to a Radio Frequency (RF) switch having a compensation circuit and a corresponding compensation method.

BACKGROUND

High voltage RF switches are known in the art for use in various applications such as the tuning of high voltage RF antennas. RF switches typically comprise a plurality of transistors stacked in a series configuration between an RF source and ground, and typically include an accompanying bias circuit for biasing nodes (also referred to as "terminals" herein) of the plurality of transistors. While the stacked configuration of the RF switch is well suited for many applications, parasitic leakage currents can start to flow in and out of the plurality of transistors at extremely high peak RF voltages (for example, in the case where the RF switch is coupled between an RF source and ground). The parasitic leakage currents can alter the designed bias voltage values of the bias circuit.

SUMMARY

In accordance with an embodiment, a radio frequency (RF) switch device comprises: a first transistor and a second transistor, each transistor comprising: a gate terminal; a source terminal; a drain terminal; and a body (or "bulk") terminal, wherein the first and second transistors are coupled together in series to establish a switchable RF path; and a first compensation network coupled between the body terminal of the first transistor and the drain terminal of the second transistor, wherein the first compensation network is configured to establish a path for current flowing between the body terminal of the first transistor and the drain terminal of the second transistor in a first direction and to block current flowing therebetween in a second direction opposite to the first direction.

In accordance with another embodiment, a radio frequency (RF) switch device comprises: a plurality of transistors in series connection forming a switchable current path; a plurality of first compensation networks coupled between a body terminal of an $N^{th}$ transistor of the plurality of transistors and a drain terminal of an $(N+1)^{th}$ transistor of the plurality of transistors, wherein each of the first compensation networks comprises a rectifying element.

In accordance with another embodiment, a method of compensating a radio frequency (RF) switch device comprising a first transistor and a second transistor forming a switchable current path, the method comprising generating a first compensation current between a body terminal of the first transistor and a drain terminal of the second transistor in a first direction and blocking current flowing therebetween in a second direction opposite to the first direction.

In accordance with another embodiment, a radio frequency (RF) switch device comprises a first transistor and a second transistor, wherein the first and second transistors are coupled in series at a common node to establish a switchable RF path between a load terminal of the second transistor and a load terminal of the first transistor; and a compensation network coupled between a body terminal of the first transistor and the load terminal of the second transistor, wherein the compensation network is configured to establish a path for current flowing between the body terminal of the first transistor and the load terminal of the second transistor in a first direction and to block current flowing therebetween in a second direction opposite to the first direction.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9A and 9B are circuit diagrams of another embodiment RF switch arrangement including a multiplicity of transistors, and including a multiplicity of leakage current compensation circuits;

FIGS. 10A, 10B, and 11 are circuit diagrams of another embodiment RF switch arrangement including a multiplicity of transistors, including at least one leakage current compensation circuit;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

High voltage RF switches described below may be used, for example, as antenna tuning switchable elements, and particularly in high voltage antenna tuning switches and tunable passive components like C-tuners (capacitor tuners), Z-tuners (impedance tuners) and the like. The high voltage RF switches are typically used in cellular handheld devices to tune the impedance and radiation properties of compact antennas. They are typically attached between the feed or aperture points of an antenna and ground via external Surface Mount Device (SMD) capacitors or inductors.

In various embodiments illustrated and described below, one or more leakage current compensation circuits are used to mitigate the effect of leakage currents that flow from the drain and source to the body of a MOS transistor in an RF switch arrangement. In various embodiments, these leakage compensation circuits may include non-linear elements, such as diodes or other rectifying elements. By compensating these leakage currents, leakage current induced shifts in the designed bias voltages of RF switches can be mitigated and/or avoided.

The leakage currents referred to herein can include gate-induced drain and source leakage currents (GIDL and GISL) that flow from drain and source terminals into the bulk of the RF switch transistors at high $V_{gs}$ voltages. These GIDL/GISL leakage currents shift the operating point of the switch transistors in the RF switch when flowing from and into the high-impedance biasing resistors. According to embodiments, the leakage compensation circuits described herein help to shift the operating point of the switch transistors in the RF switch closer to the originally designed operating point despite the presence of significant leakage currents, when compared to an uncompensated RF switch. The GIDL/GISL leakage currents are caused by quantum mechanical effects and changes in carrier transport within the switch transistor. The GIDL leakage current, for example, is caused at least in part by tunneling taking place in the narrow depletion region at the drain underneath the gate oxide.

Figure 1:
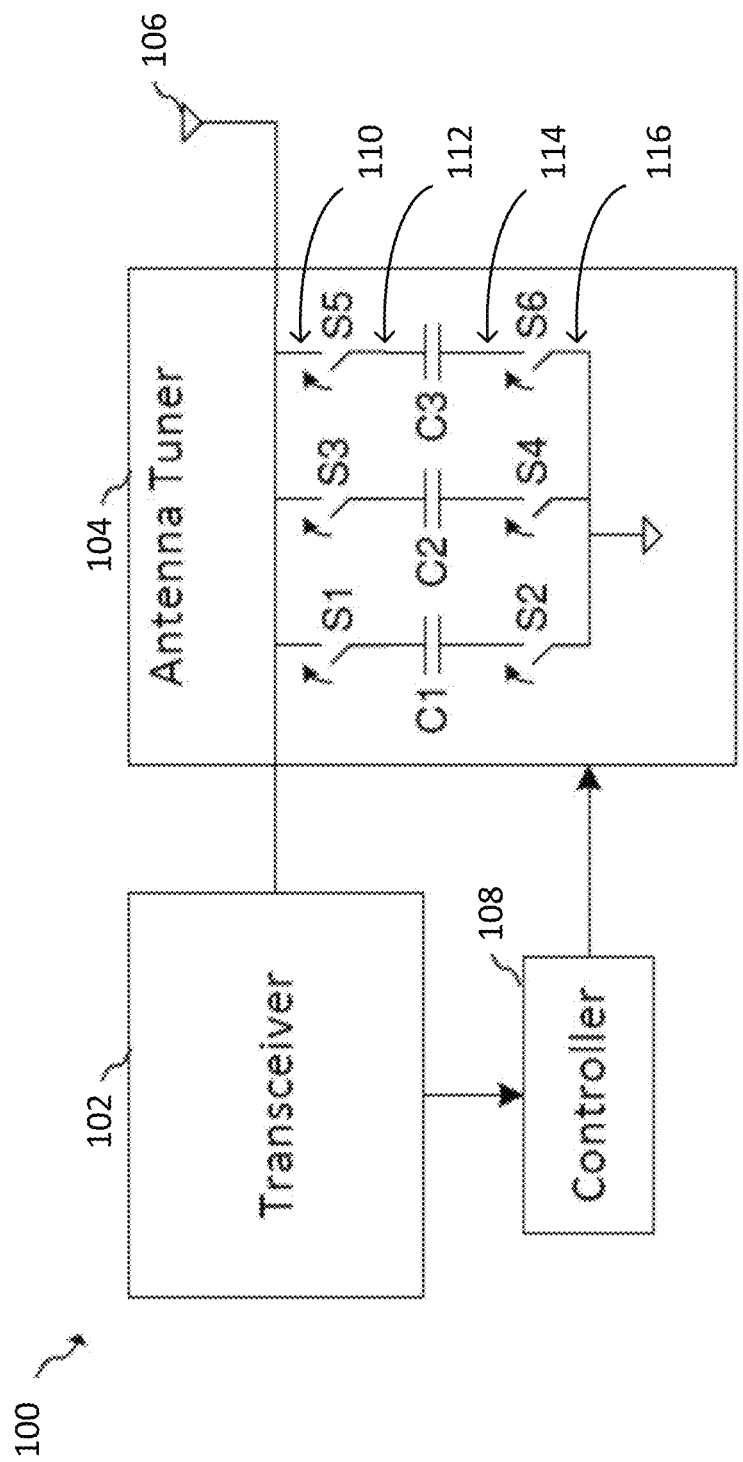
FIG. 1 illustrates a block diagram of an embodiment RF system that includes a transceiver, an antenna tuner comprising a plurality of capacitors and RF switches, an antenna, and a controller.

FIG. 1 illustrates an RF system 100 that may be configured to utilize embodiment RF switching arrangements. As shown, RF system 100 includes an RF transceiver 102 coupled to an antenna 106 via antenna tuner 104. Antenna tuner includes shunt capacitors C1, C2 and C3 that can be selectively coupled to antenna 106 via switches S1, S2, S3, S4, S5 and S6. In various embodiments, switches S1, S2, S3, S4, S5 and S6 may be implemented using RF switching arrangements described herein. During operation, controller o18 provides control signals that selectively turns-on and turns-off switch S1, S2, S3, S4, S5 and S6 according to an antenna setting provided by transceiver 102. The switch configuration of antenna tuner may be used to provide an RF match between antenna 106 and transceiver 102 over a variety of frequencies. RF system 100 may be used, for example, in multi-band cellular communication applications. It should be understood that RF system 100 is just one of many application examples that can utilize embodiment RF switching arrangements. RF switches can be used in applications requiring signal selection switches, for example, and in microwave test system applications for signal routing between instruments and devices under test.

In FIG. 1, representative RF switch nodes 110, 112, 114, and 116 are also shown to further illustrate the applied RF voltages across the switches. For example, a first switching node 110 of switch S5 is coupled to an RF voltage source provided by antenna 106. A second switching node 112 is coupled to an intermediate RF voltage source provided by a first node of capacitor C3. A first switching node 114 of switch S6 is coupled to another intermediate RF voltage source provided by a second node of capacitor C3. A second switching node 116 of switch S6 is coupled directly to ground. Switches S5 and S6 are switched between the "on" state and the "off" state by application of a transistor gate voltage that is illustrated and described in further detail below with reference to FIGS. 2A and 2B. Thus, RF switches can be placed between a first source of RF voltage and a second source of RF voltage, or between a source of RF voltage and ground, in embodiments. Other RF voltage sources can be used including RF voltage sources for providing an alternating voltage signal, for example.

A typical challenge in antenna tuning switch design is to achieve high voltage handling at RF frequencies, reaching values of 80 V peak or above, while sustaining the same or similar performance as at lower RF voltages. The switches are implemented as stacked MOSFET devices on a silicon or other substrate.

In various embodiments, a MOS transistor used in RF switch arrangements comprises a gate terminal, a source terminal, a drain terminal and a body terminal. The MOS transistor is biased to the desired operating point by the use of high-ohmic linear resistors. In some embodiments, a high-resistive DC path is provided for all terminals, including gate, source, drain and body terminals. After applying target DC voltages at each terminal via high-ohmic bias resistors the gate-source, gate-drain, drain-body and source-body voltages define the operating point of the MOS transistor in the switch arrangement.

Parasitic leakage currents may be generated at high operating voltages and can flow into the high-ohmic bias resistors generating significant voltage drops. Thus, the desired operating point of the high voltage RF switch can be shifted from the desired operating point, causing a loss of performance, and in extreme cases, signal distortion.

Figure 2A:
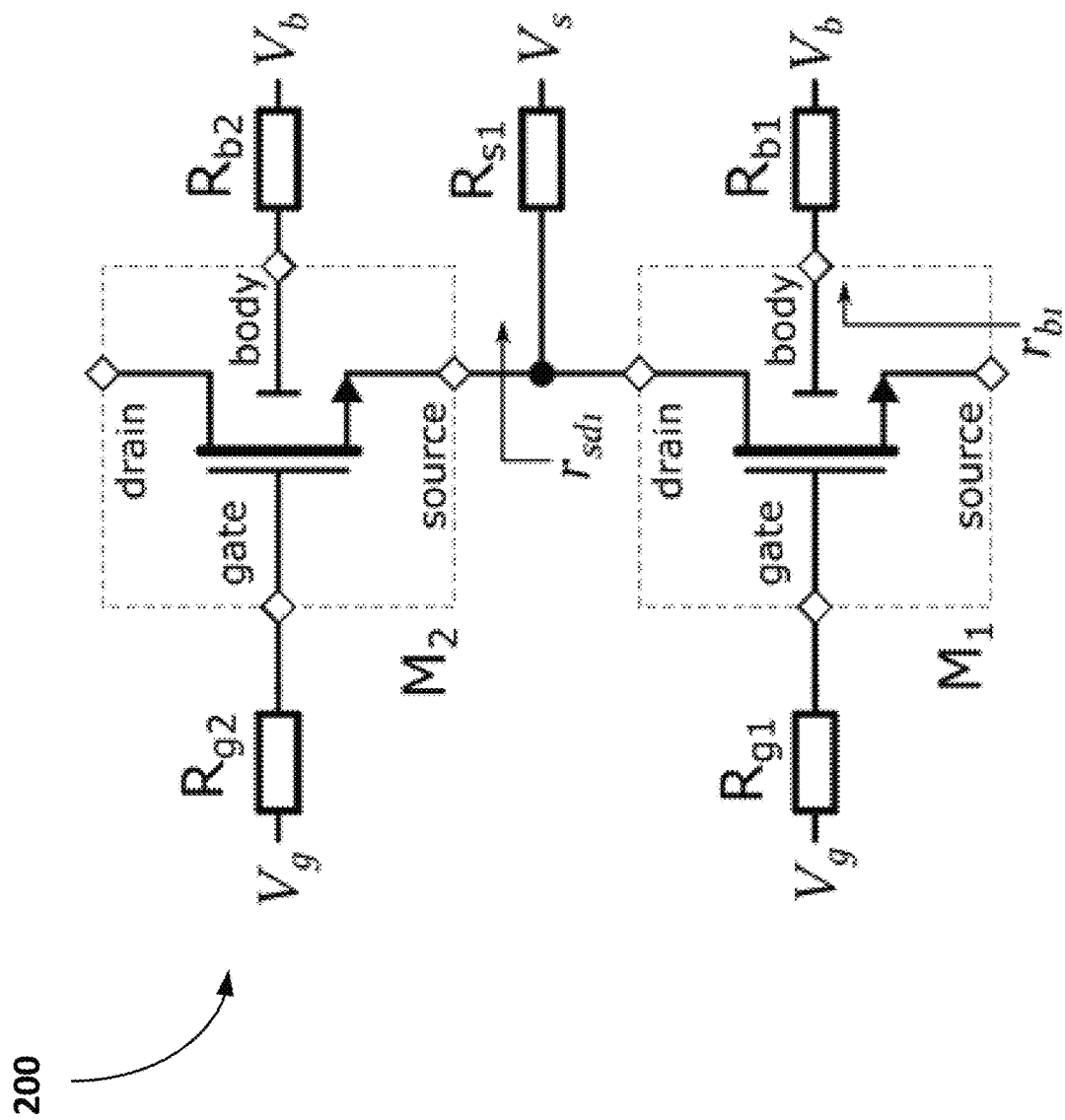
FIG. 2A is a circuit diagram of an RF switch arrangement including an exemplary bias network.
Figure 2B:
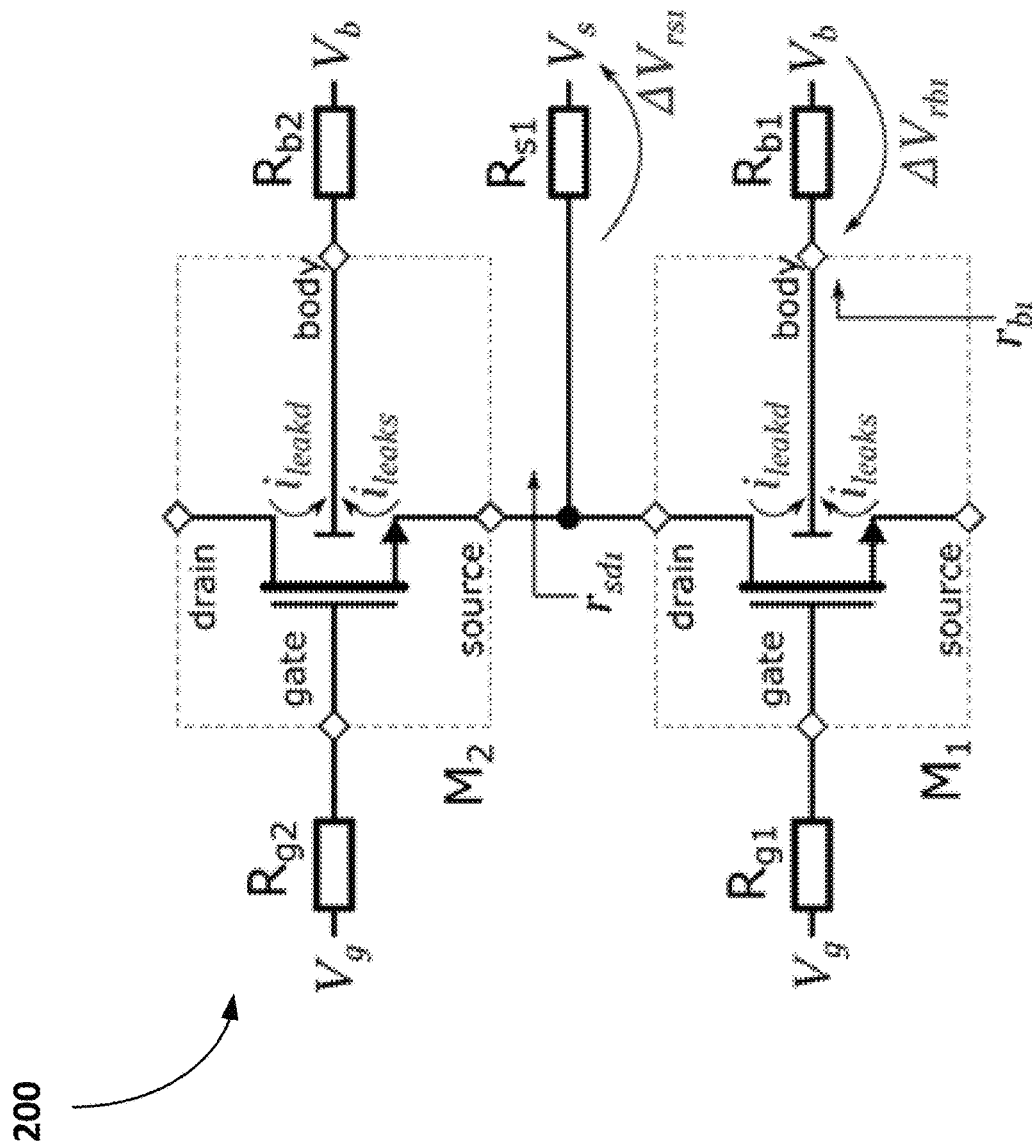
FIG. 2B is a circuit diagram of the RF switch arrangement of FIG. 2A exposed to high RF voltages, creating leakage currents and corresponding voltage shifts away from designed bias voltages.
Figure 3:
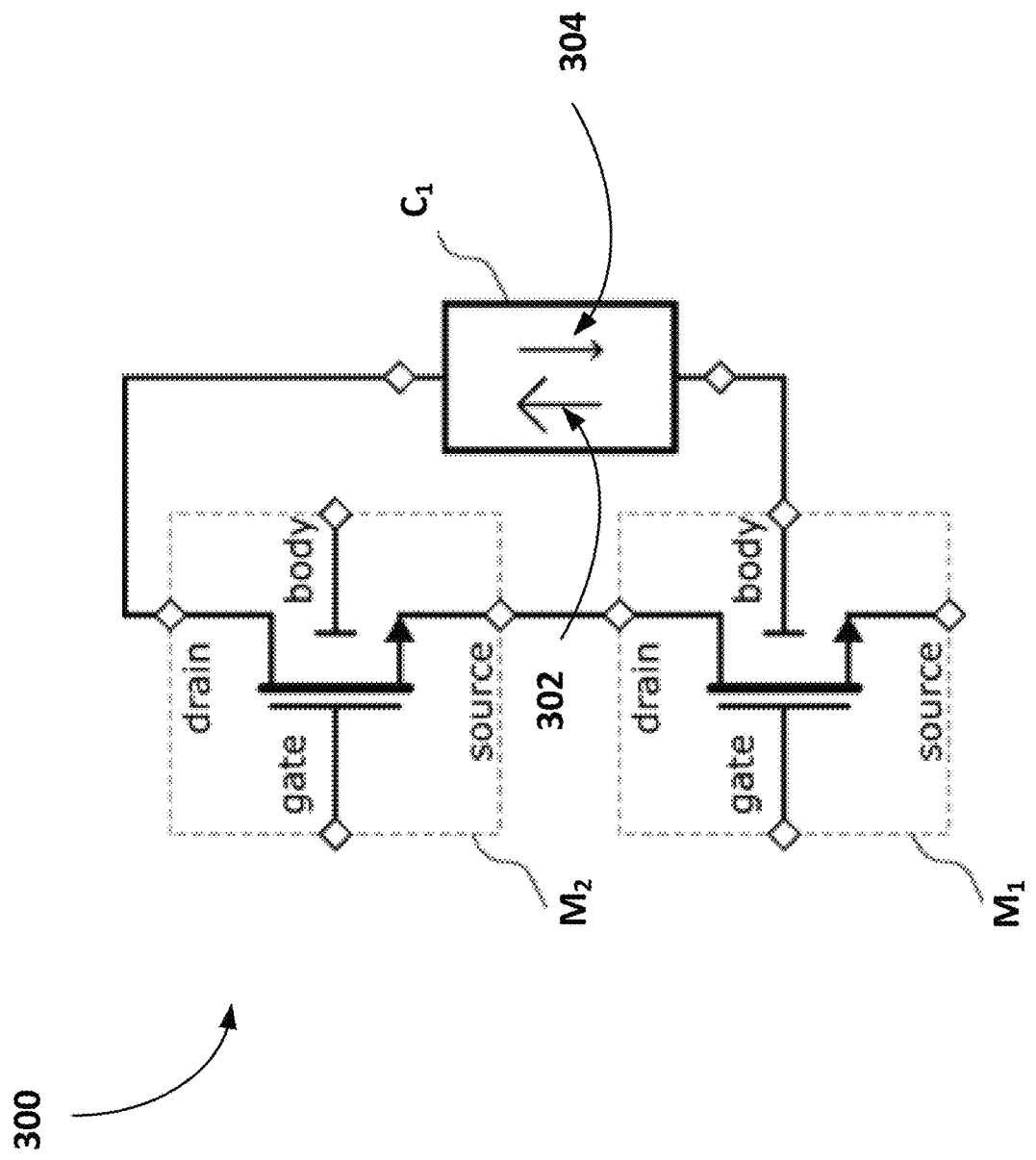
FIG. 3 is a circuit diagram of an embodiment RF switch arrangement as in FIGS. 2A and 2B, but wherein the bias circuit is removed, and including a leakage current compensation circuit.
Figure 4:
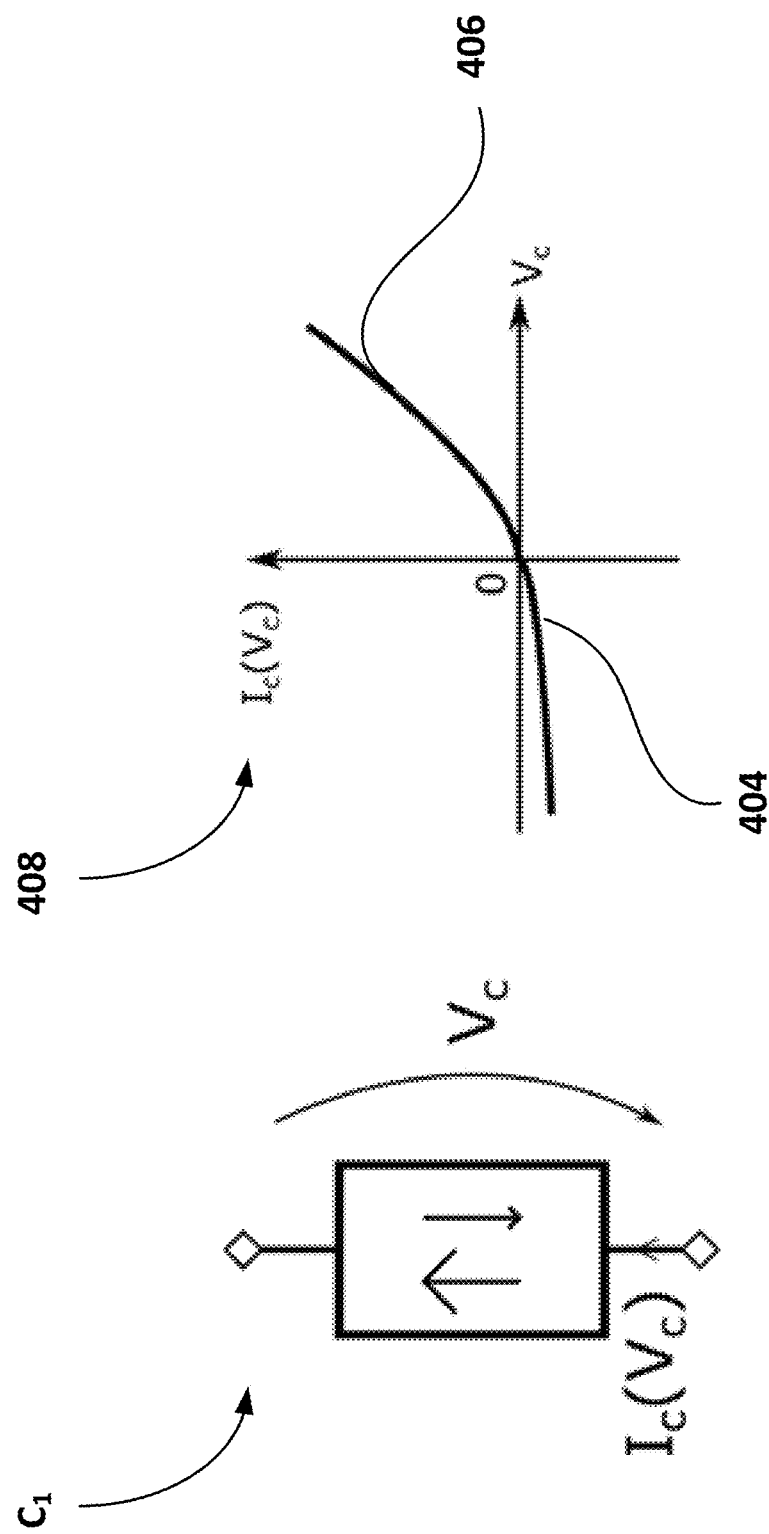
FIG. 4 illustrates the typical I-V response of the leakage current compensation network shown in FIG. 3, according to an embodiment.
Figure 5:
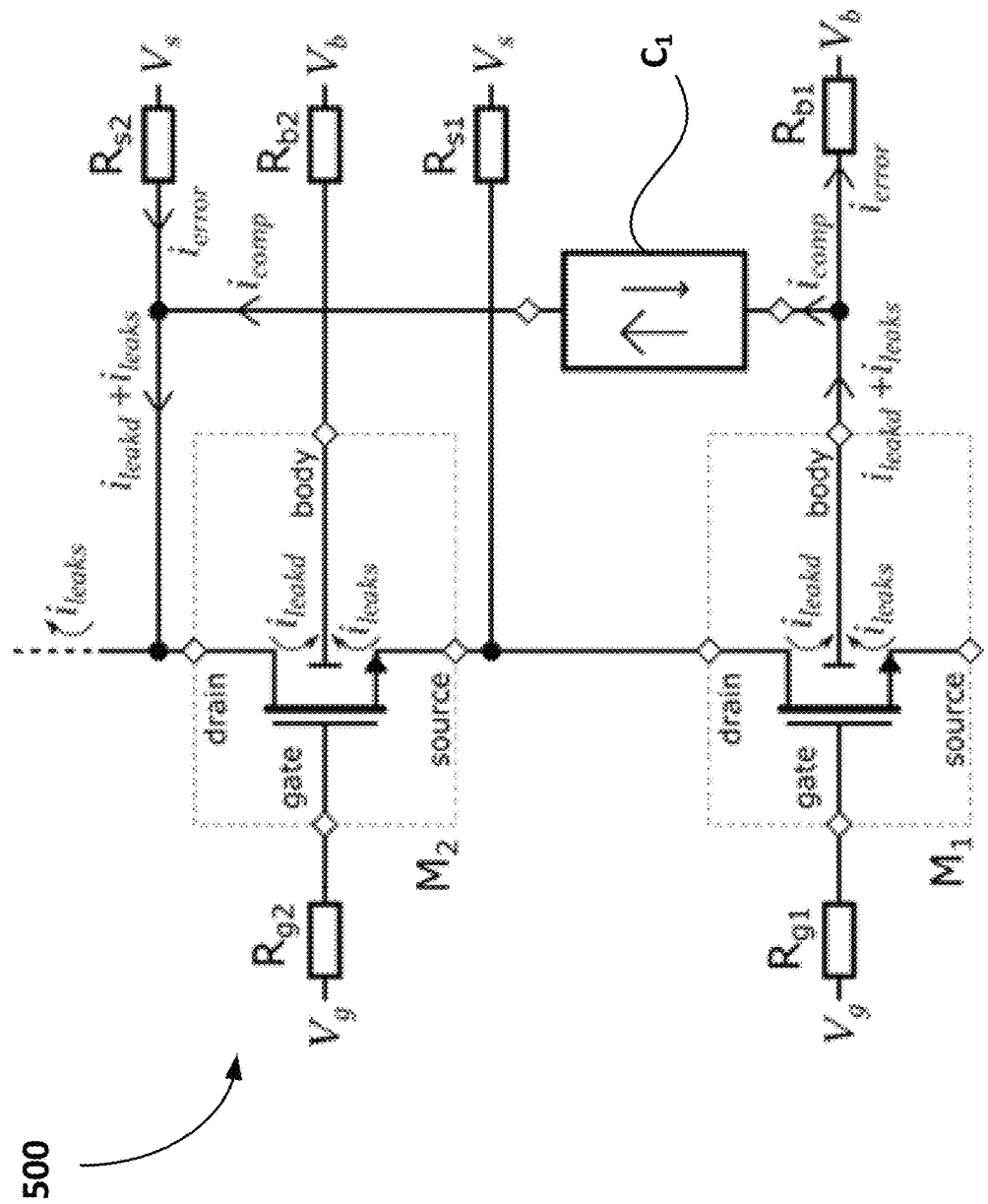
FIG. 5 is a circuit diagram illustrating the current distribution in a compensated RF switch arrangement, including the biasing circuit, according to an embodiment.

FIGS. 2A, 2B, 3, 4, and 5 show a sequence of circuit diagrams that are described below to further aid in understanding both the nature and effects of these leakage currents, and the solution provided by embodiment leakage compensation circuits. FIG. 2A is a circuit diagram of a portion of an uncompensated RF switch arrangement including a bias circuit. FIG. 2B is the same circuit diagram as shown in FIG. 2A, but showing the gate induced drain and source leakage currents once the RF switch arrangement is exposed to a high voltage RF signal. FIG. 3 is a circuit diagram of the same portion of the RF switch arrangement, including the leakage current compensation circuit, but wherein the biasing circuitry is removed for ease of understanding the operation of the compensation circuit. FIG. 4 illustrates the non-linear nature of the leakage compensation circuit, and FIG. 5 shows the same portion of the RF switch arrangement as previously illustrated, but including both the biasing circuitry and the leakage compensation circuit.

FIG. 2A shows an exemplary circuit portion 200 of a high voltage RF switch including a first NMOS transistor $M_1$ in series connection with a second NMOS transistor $M_2$. In the series connection, the source node of transistor $M_1$ is coupled to the drain node of transistor $M_2$. The drain node of transistor $M_2$ is coupled directly to an RF high voltage source, or indirectly through one or more transistors, also in series connection. The source node of transistor $M_1$ is coupled directly to ground or to another RF high voltage source, or indirectly through one or more transistors, also in series connection. The gate node of transistor $M_1$ is coupled to gate bias voltage $V_g$ through biasing resistor $R_{g1}$, and the gate node of transistor $M_2$ is coupled to gate bias voltage $V_g$ through biasing resistor $R_{g2}$. The body node of transistor $M_1$ is coupled to body bias voltage $V_b$ through biasing resistor $R_{b1}$, and the body node of transistor $M_2$ is coupled to body bias voltage $V_b$ through biasing resistor $R_{b2}$. The source-drain node between transistors $M_1$ and $M_2$ is coupled to the $V_s$ bias voltage through resistor $R_{s1}$. The above-described biasing circuitry can be repeated and used for any additional series connected transistors not shown in FIG. 2A. The gate nodes of the first and second transistors are switched to turn the transistors on and off. In an embodiment, the switchable current path though the switch is from the drain node to the source node of the second transistor $M_2$ and from the drain node to the source node of the first transistor $M_1$.

The RF switch arrangement shown in FIG. 2A provides a high impedance $r_{sd1}$ at the source-drain nodes and $r_{b1}$ at body nodes, with possibly different absolute values for $r_{sd1}$ and $r_{b1}$ for other RF switch arrangements described below.

FIG. 2B is a circuit diagram of the RF switch arrangement 200 exposed to high RF voltages. The circuit of FIG. 2B is thus similar to the circuit shown in FIG. 2A, except for the additional labeled leakage current and labeled shifted biasing voltages. The leakage currents generated from exposure to the applied high RF voltages and their effect on the biasing circuitry is described in further detail below.

When the RF switch 200 is exposed to high peak voltages at RF frequencies (defined as the peak voltage at which the voltage drop across each individual transistor in the stack approaches maximum allowable level for a given MOS transistor type), parasitic leakage currents $i_{leakd}$ and $i_{leaks}$ start flowing from the drain and source terminals into the body terminals of the respective MOS transistor in the RF switch arrangement. This current shifts the operating point of MOS transistors when flowing into respective high-ohmic bias resistors: the source voltage is shifted by the value of $\Delta V_{rs1} = R_{s1}(i_{leakd} + i_{leaks})$; and the body voltage is shifted by the value of $\Delta V_{rb1} = R_{b1}(i_{leakd} + i_{leaks})$. The bias-shifting effect of the parasitic leakage currents is illustrated in FIG. 2.

FIGS. 2A and 2B are circuit diagrams of bias networks in RF switch arrangements for RF switch arrangements having two MOS transistors. While two transistors coupled in a series arrangement are shown in the circuits of FIGS. 2A and 2B, it will be appreciated by those skilled in the art that these circuits can be part of a larger high voltage RF switch including a multiplicity of series-coupled transistors (for example, ten or twenty such transistors, in an embodiment). The total number of transistors used in the switch is determined by the breakdown voltage of each transistor in the switch, and the maximum applied peak RF voltage that is switched.

FIG. 3 is a circuit diagram 300 of an embodiment RF switch arrangement (a switch arrangement is also referred to as an RF switch device herein, and can refer to a compensated or uncompensated RF switch comprising a plurality of RF transistors in a series connected stacked configuration) including transistors $M_1$ and $M_2$, and a leakage current compensation circuit $C_1$. In FIG. 3, the biasing circuits previously shown in FIGS. 2A and 2B are not shown for ease in understanding the leakage current compensation circuit $C_1$. Leakage current compensation circuit $C_1$ can be used with the biasing circuits illustrated in FIG. 2A or 2B, or other biasing circuits. Leakage current compensation circuit $C_1$ can also be used with other biasing circuits. One or more leakage compensation circuits can be used in an RF switch to direct leakage currents away from the biasing resistors and back into the RF switch in such a manner that the desired biasing voltages are not shifted away from a designed nominal value. In embodiments, one or two compensation circuits are provided for each transistor in the RF switch; however, a one-to-one correspondence between the compensation circuits and the transistors is not necessary. A plurality of compensation circuits less than a plurality of transistors in the RF switch, or even one compensation circuit, will still have a positive effect on maintaining biasing voltages when compared to an uncompensated RF switch.

According to an embodiment, a leakage current compensation circuit $C_1$ comprising a non-linear compensation network is coupled between the body terminal of the first transistor $M_1$ and the drain terminal of the second transistor $M_2$ in the RF switch arrangement 300 as shown in FIG. 3. The nonlinear compensation network of leakage current compensation circuit $C_1$ is configured to bypass a current in a first direction (large arrow designation 302) from the body terminal of the first transistor M1 towards the drain terminal of the second transistor $M_2$ for a given voltage across the network and blocking a current in a second direction (small arrow designation 304) from the drain terminal of the second transistor $M_2$ towards the body terminal of the first transistor $M_1$ if the applied voltage is reversed. In this manner, the leakage currents are absorbed back into the RF switch stack through the leakage compensation circuit and are not available to shift the desired biasing voltages as is described in further detail below, particularly with respect to the description of FIG. 5.

In some embodiments, RF switch arrangement 300, other RF switch arrangements, as well as the individual switch transistors such as transistors $M_1$ and $M_2$ described herein are symmetrical so that the source and drain designations such as those shown in FIG. 3 are interchangeable. In some embodiments, the individual switch transistors may be physically symmetrical, wherein the layout and configuration of the source and drain is substantially identical. Thus, the drain may be designated as a load terminal, and the source may also be designated as a load terminal. Thus, in FIG. 3, RF switch arrangement 300 comprises a first transistor $M_1$ and a second transistor $M_2$ coupled in series at a common node (source of transistor $M_2$ and drain of transistor $M_1$) to establish a switchable RF path between a load terminal of transistor $M_2$ (drain of transistor $M_2$) and a load terminal of transistor $M_1$ (source of transistor $M_1$) and a compensation network coupled between a body terminal of transistor $M_1$ and the load terminal of transistor $M_2$, wherein the compensation network is configured to establish a path for current flowing between the body terminal of the first transistor and the load terminal of the second transistor in a first direction and to block current flowing therebetween in a second direction opposite to the first direction.

FIG. 4 illustrates the typical I-V response 408 of the leakage current compensation network $C_1$ according to an embodiment. In general terms, if the I-V characteristic 408 of the compensation network $C_1$ is described by a function $I_c(V_c)$, where $I_c$ is a current flowing through the network 400 and $V_c$ is a voltage applied over the network, as shown in FIG. 4, the following relation in equation [1] generally holds true:

$$I_c(V_c) > -I_c(-V_c). \qquad [1]$$

Equation [1] might not pertain under certain anomalous conditions, such as during breakdown conditions of the diodes or diode-connected transistors used in the compensation network.

FIG. 5 is a circuit diagram illustrating the current distribution in a compensated RF switch arrangement, according to an embodiment. FIG. 5 shows the RF switch circuit components and biasing components previously shown with respect to FIG. 1A, and the leakage current labels shown in FIG. 2, as well as the leakage current compensation circuit shown in FIG. 3. In addition, FIG. 5 includes an illustration of "error currents" flowing through the biasing resistors that are ideally minimized as is described in further detail below.

The characteristic of the compensation network $C_1$ is configured such that the average current flowing from the body terminal of the first transistor $M_1$ into the drain terminal of the second transistor $M_2$ is similar to $(i_{leakd}+i_{leaks})$ for a given RF operating voltage, such that the leakage currents from the body terminal is forwarded mostly into the drain terminal of the second transistor and only a portion of the leakage current flows into the bias resistors, as shown in FIG. 5.

The current in the compensated RF switch arrangement are summed up as follows: Each MOS transistor in the RF switch generates leakage current of $(i_{leakd}+i_{leaks})$; the compensation network bypasses the current of $i_{comp}$ between the body terminal of the first transistor $M_1$ and the drain terminal of the second transistor $M_2$; the error current of $i_{error}$, which is a difference between $(i_{leakd}+i_{leaks})$ and $i_{comp}$ flows into the bias resistors; and the leakage current compensation network $C_1$ may be optimized to provide $|i_{error}|<|i_{leakd}+i_{leaks}|$, ideally $|i_{error}|=0$. If the error current through bias resistors $R_{s2}$ and $R_{b1}$ is minimized or reduced, so is the corresponding voltage drop on these bias resistors, such that the shift of operating point at high power (high applied RF voltage) is made smaller when compared to an uncompensated RF switch arrangement. The current compensation network may be configured to provide a compensation current $i_{comp}$ exceeding the leakage current $(i_{leakd}+i_{leaks})$, such that $i_{error}$ changes polarity and the RF switch becomes overcompensated, meaning that the gate-source bias voltage of the RF switch arrangement increases with the increase of applied RF voltage.

FIG. 5 thus demonstrates an example of a compensated RF switch arrangement with a shunt body and drain/source bias network, according to the bias circuit shown in FIGS. 2A and 2B. Leakage current compensation circuit $C_1$ can also be used with any other configuration of bias network if desired.

Figure 6:
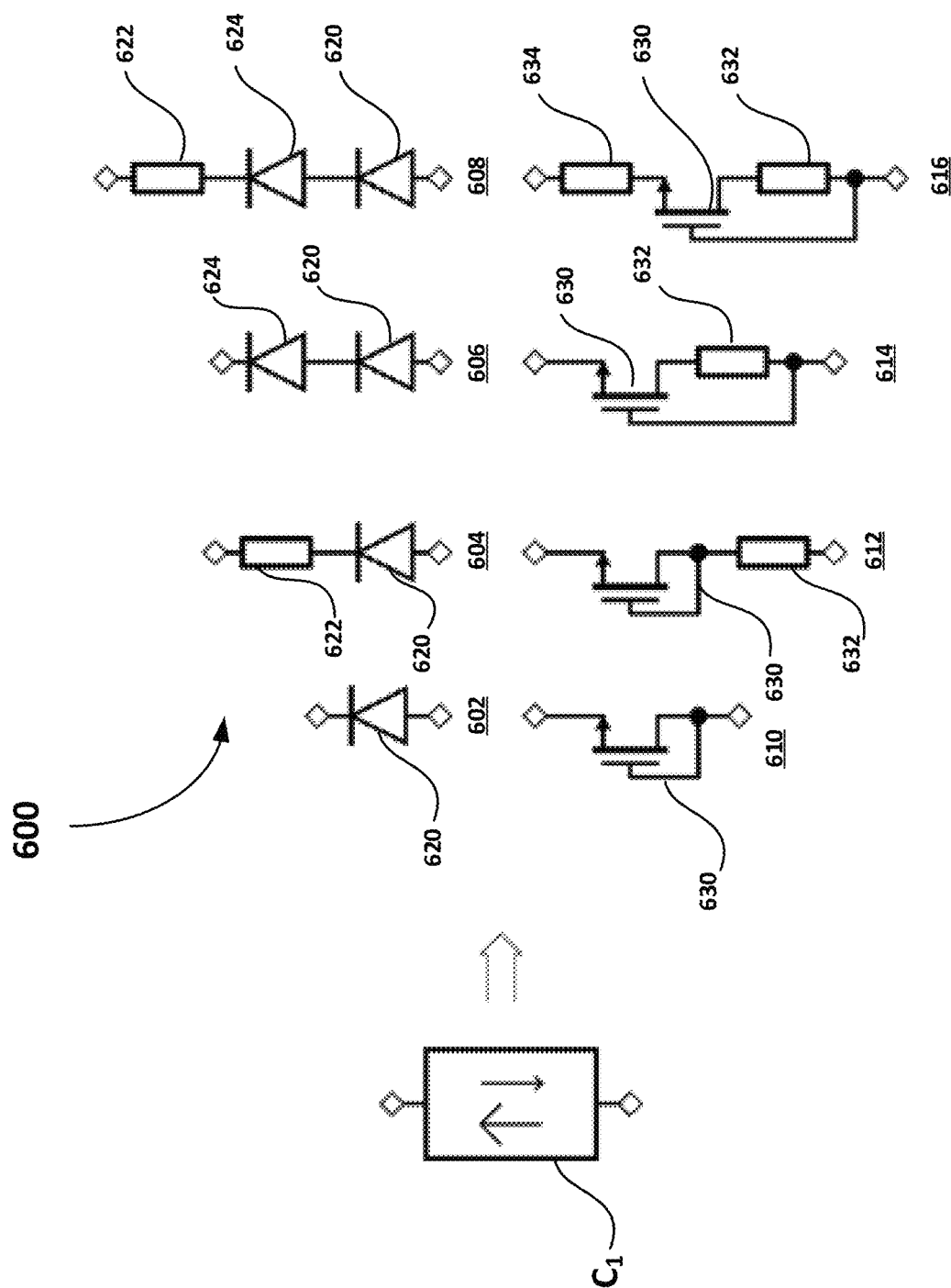
FIG. 6 illustrates examples of specific implementations of the compensation network, according to embodiments.

FIG. 6 illustrates examples of specific implementations of the compensation network $C_1$, according to embodiments.

Various implementations of the compensation network $C_1$ providing the response that generally satisfies the relationship shown in Equation [1] (except for anomalous operating conditions, such as breakdown conditions) can be used. The network may be implemented using rectifying components such as passive components, including diodes, diodes and resistors, transistors in diode configurations, as well as combination of passive and active rectifying components, including amplifiers, operational amplifiers in feedback loops, and other similar circuits. The list of possible implementations for the compensation network $C_1$ includes, but is not limited to:

A semiconductor diode circuit 602 comprising a single diode 620, also known as a p-n junction;

A semiconductor diode circuit 606 comprising plurality of semiconductor diodes 620 and 624 coupled in series;

A semiconductor diode circuit 604 comprising a semiconductor diode and a resistor 622;

A semiconductor diode circuit 608 comprising a plurality of semiconductor diodes 620 and 624 coupled in series with a resistor 622;

A transistor circuit 610 comprising a transistor 630 in a diode connection (diode-connected transistor);

A transistor circuit 612 comprising a transistor 630 in a diode connection coupled in series with a resistor 632;

A transistor circuit 614 comprising a transistor 630 in a diode connection with a resistor 632 coupled in series with the channel; and A circuit comprising a transistor 630 in a diode connection comprising multiple resistors 632 and 634 coupled in series.

Diodes in FIG. 6 can be implemented by diffused regions in a silicon or other substrate, and can comprise a polysilicon diode, a Zener diode, a Schottky diode, or any other types of diodes. Diode-connected transistors can comprise diode-connected MOSFETS, diode-connected bipolar devices such as BJTs, junction field-effect transistors, as well as any other type of transistors. Resistors can comprise integrated circuit diffused or metal resistors and can be sized to match the peak leakage current, in an embodiment. For example, for leakage current circuit 604, the voltage across resistor 622 is determined by measuring the voltage across circuit 604 minus the voltage across diode 620. The remaining voltage across resistor 622 is divided by the peak leakage current desired to be compensated, to determine the value of resistor 622. Resistor 622 thus generates a matching current less than or equal to the peak leakage current. In the case of an overcompensated RF switch, resistor 622 generates the matching current exceeding the peak leakage current.

There are also other implementations of the non-linear function previously described that can be used having rectifying properties, which allow bypassing a larger current in one direction than in the opposite direction. Many integrated and discrete components are available to implement the rectifying properties used in the leakage current compensation circuit described herein.

Figure 7:
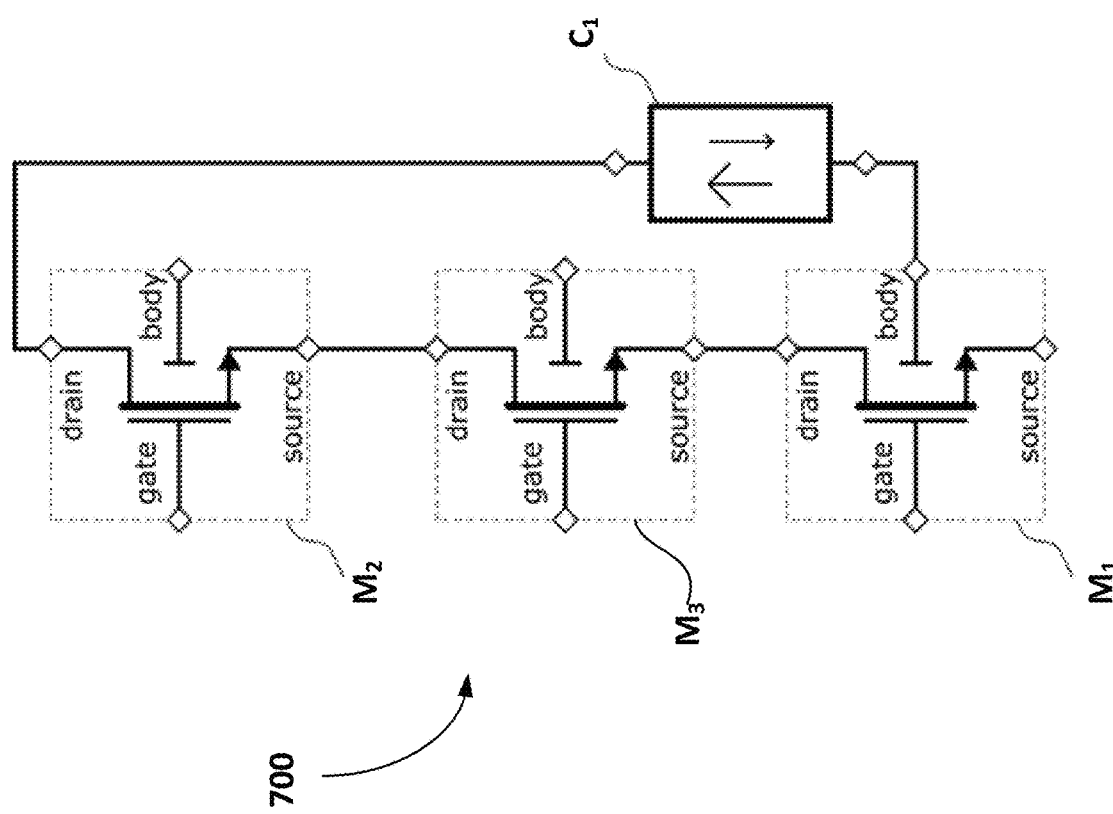
FIG. 7 is a circuit diagram of another embodiment RF switch arrangement, including a leakage current compensation circuit.

FIG. 7 is a circuit diagram 700 of another embodiment RF switch arrangement, including a leakage current compensation circuit $C_1$ as previously described, with respect to, for example, FIG. 3. While a biasing circuit is not shown in FIG. 7 for ease of understanding circuit diagram 700, a biasing circuit would be implemented in a normal application. Transistors $M_1$ and $M_2$ and leakage current compensation circuit $C_1$ shown in FIG. 7 and their interconnections have been previously described. However, in FIG. 7, note that an additional transistor $M_3$ has been interposed in series connection between transistors $M_1$ and $M_2$. That is, the drain node of transistor $M_3$ is coupled to the source node of transistor $M_2$, and the source node of transistor $M_3$ is coupled to the drain node of transistor $M_1$. In the configuration shown in FIG. 7, leakage currents flowing out of the body node of transistor $M_1$ are bypassed through the action of leakage current compensation circuit $C_1$ and flow into the drain of transistor $M_2$. Additional transistors (one, two, or even more such transistors) in series connection such as transistor $M_3$ can be interposed between transistors $M_1$ and $M_2$.

Figure 8A:
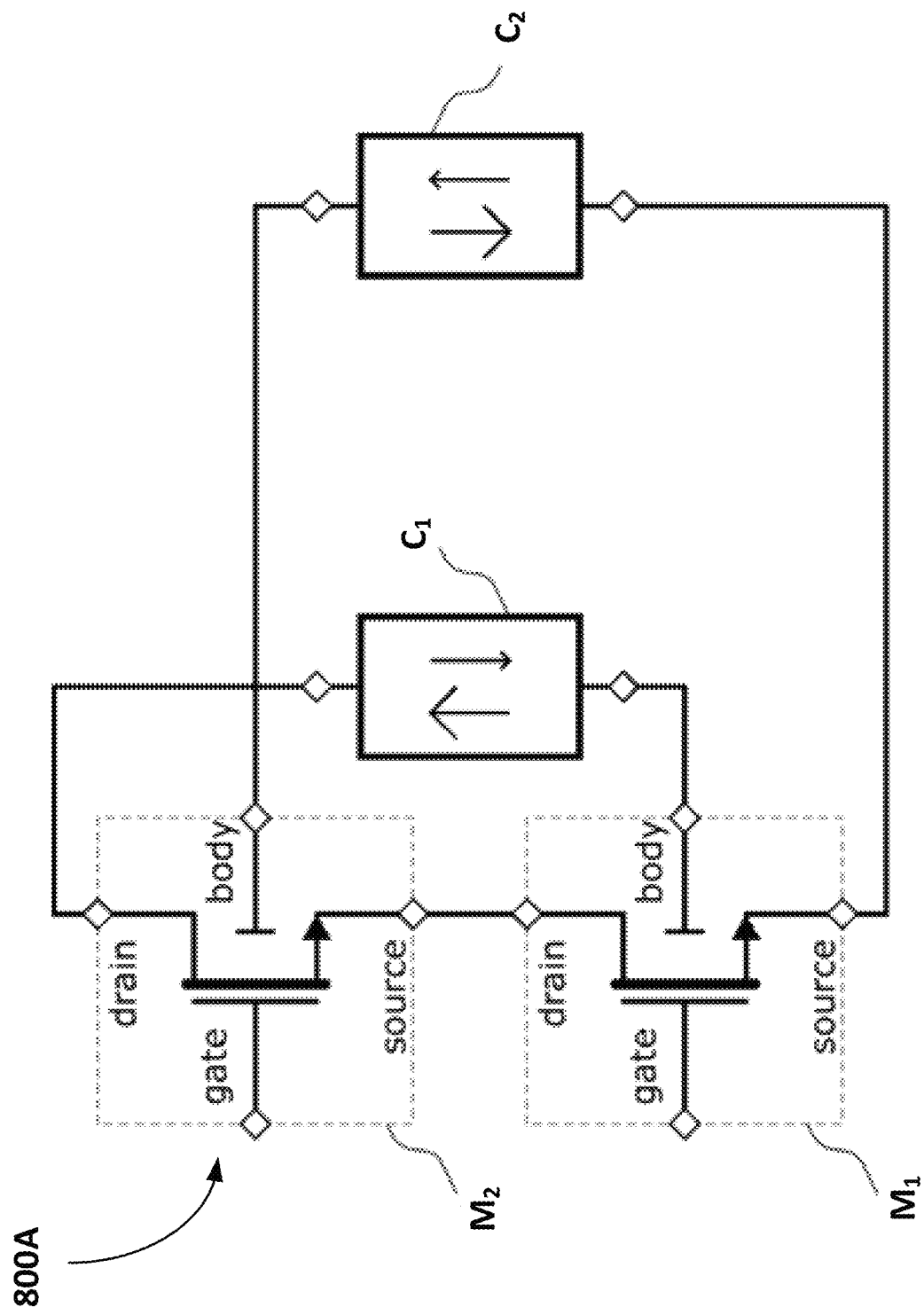
FIGS. 8A and 8B are circuit diagrams of another embodiment RF switch arrangement, including leakage current compensation circuits.
Figure 8B:
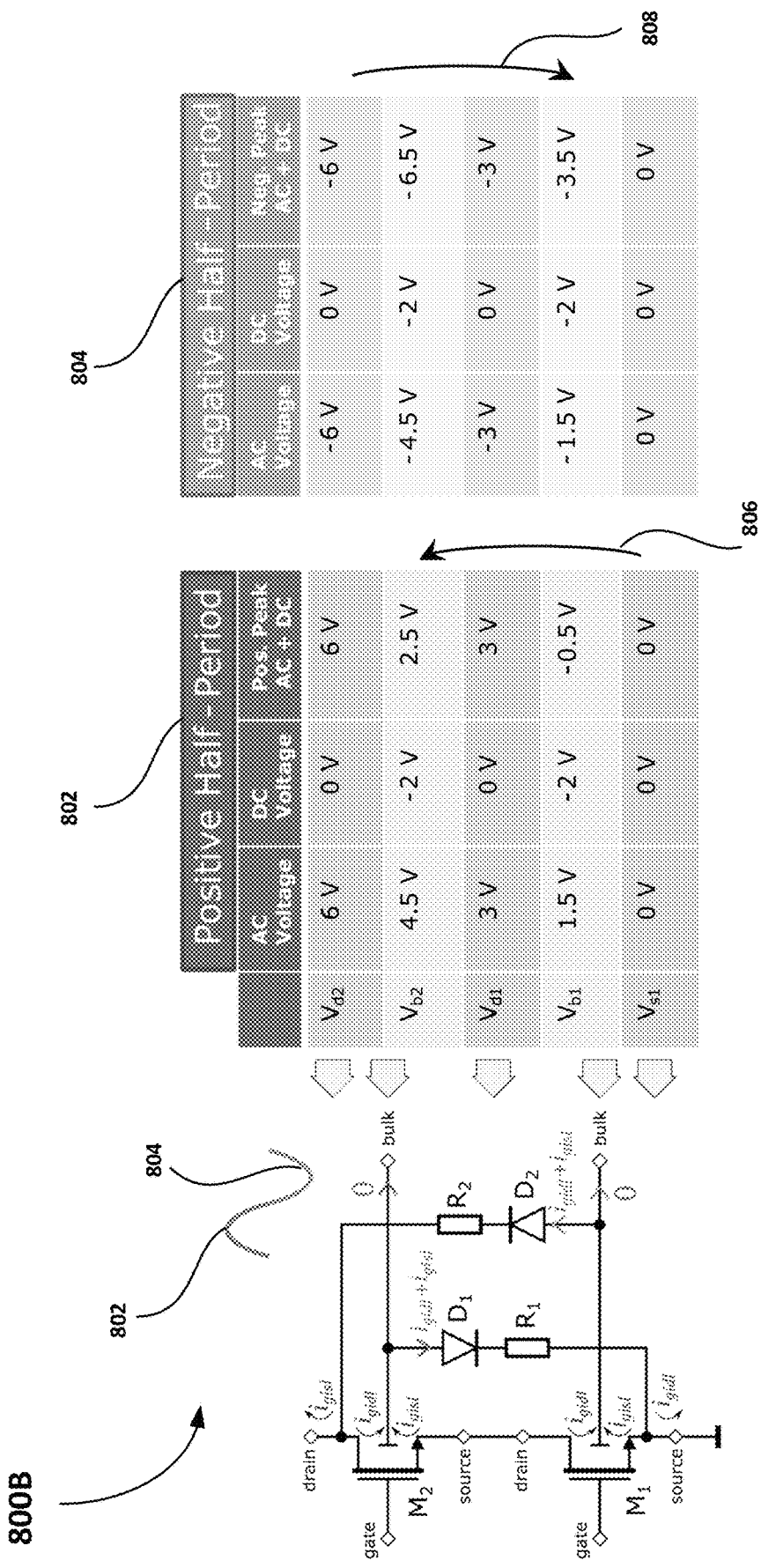

FIGS. 8A and 8B are circuit diagrams of another embodiment RF switch arrangement, including leakage current compensation circuits for compensating leakage currents generated during both a positive half-period and a negative half-period of a sinusoidal or other periodic RF signal waveform applied to the RF switch arrangement. Again, the biasing circuit is omitted for clarity in FIGS. 8A and 8B, but would be included in a normal application.

FIG. 8A illustrates a circuit 800A including transistors $M_1$, $M_2$, and leakage current compensation circuit $C_1$, all previously described with respect to, for example, FIG. 3. In addition, FIG. 8A shows a second leakage current compensation circuit $C_2$ coupled between the source node of transistor $M_1$ and the body node of transistor $M_2$. In the configuration shown in FIG. 8A, leakage currents flowing out of the body node of transistor $M_1$ are bypassed through the action of leakage current compensation circuit $C_1$ and flow into the drain of transistor $M_2$ in a first half-period of an applied RF signal waveform. In the configuration shown in FIG. 8A, leakage currents flowing out of the body node of transistor $M_2$ are bypassed through the action of leakage current compensation circuit $C_2$ and flow into the drain of transistor $M_1$ in a second half-period of the applied RF signal waveform. The action of compensation circuits $C_1$ and $C_2$ are explained in further detail below with reference to a specific example shown in FIG. 8B.

FIG. 8B illustrates a circuit 800B including transistors M1 and M2 as in FIG. 8A. Leakage current compensation circuit $C_1$ is shown in FIG. 8B as a specific implementation including diode $D_1$ and series connected resistor $R_1$. Leakage current compensation circuit $C_2$ is shown in FIG. 8B as a specific implementation including diode $D_2$ and series connected resistor $R_2$. During a positive half-period 802 of an applied RF voltage, the parasitic leakage currents $i_{gidl}$ and $i_{gisl}$ flow out of the bulk node of transistor $M_2$ through diode $D_1$ and resistor $R_1$ and flow into the source node of transistor $M_1$. If resistor $R_1$ is sized correctly, the current flowing out of the bulk node of transistor $M_2$ will be zero. During a negative half-period 804 of the applied RF voltage, the parasitic leakage currents $i_{gidl}$ and $i_{gisl}$ flow out of the bulk node of transistor $M_1$ through diode $D_2$ and resistor $R_2$ and flow into the drain node of transistor $M_2$. If resistor R2 is sized correctly, the currently flowing out of the bulk of transistor $M_1$ will be zero.

Exemplary DC biasing voltages and the peak AC applied RF voltages during the positive half-period 802 and the negative half-period 804 are also illustrated in FIG. 8B. The DC biasing voltages and the peak AC applied RF voltages are only examples, and other voltages may be used in a different application. Different voltages will also appear if other transistors (not shown) different than transistors $M_1$ and $M_2$ in the RF switch stack are analyzed.

During the positive half-period 802, the peak AC voltage at the drain node of transistor $M_2$ ($V_{d2}$) is six volts, the peak AC voltage at the bulk node of transistor $M_2$ ($V_{b2}$) is 4.5 volts, the peak AC voltage at the drain node of transistor $M_1$ ($V_{d1}$) is three volts, and the peak AC voltage at the bulk node of transistor $M_1$ ($V_{b1}$) is 1.5 volts. The source of transistor $M_1$ is coupled to ground in FIG. 8B. During the positive half-period 802, the DC biasing voltage at the drain node of transistor $M_2$ ($V_{d2}$), the drain node of transistor $M_1$ ($V_{d1}$), and the source node of transistor $M_1$ ($V_{s1}$), are all set to zero volts. The DC biasing voltage at the bulk node of transistor $M_2$ ($V_{b2}$) and the DC biasing voltage at the bulk node of transistor $M_1$ ($V_{b1}$) are both set to negative two volts. The sum of the AC and DC voltages is thus six volts at the drain of transistor $M_2$ ($V_{d2}$), 2.5 volts at the bulk node of transistor M2 ($V_{b2}$), three volts at the drain node of transistor $M_1$ ($V_{d1}$), −0.5 volts at the bulk node of transistor $M_1$ ($V_{b1}$), and zero volts at the source node of transistor $M_1$. The voltage 806 across the first leakage compensation circuit comprising diode $D_1$ and resistor $R_1$ is thus 2.5 volts. Resistor $R_1$ can therefore be appropriately sized to generate a corresponding compensation current less than or equal to the sum of parasitic leakage currents $i_{gidl}$ and $i_{gisl}$ so that only a small or no error current flows into or out of the bulk node of transistor $M_2$.

During the negative half-period 804, the peak AC voltage at the drain node of transistor $M_2$ ($V_{d2}$) is negative six volts, the peak AC voltage at the bulk node of transistor $M_2$ ($V_{b2}$) is −4.5 volts, the peak AC voltage at the drain node of transistor $M_1$ ($V_{d1}$) is negative three volts, and the peak AC voltage at the bulk node of transistor $M_1$ ($V_{b1}$) is −1.5 volts. The source of transistor $M_1$ is coupled to ground in FIG. 8B. During the negative half-period 804, the DC biasing voltage at the drain node of transistor $M_2$ ($V_{d2}$), the drain node of transistor $M_1$ ($V_{d1}$), and the source node of transistor $M_1$ ($V_{s1}$), are all set to zero volts. The DC biasing voltage at the bulk node of transistor $M_2$ ($V_{b2}$) and the DC biasing voltage at the bulk node of transistor $M_1$ ($V_{b1}$) are both set to negative two volts. The sum of the AC and DC voltages is thus negative six volts at the drain of transistor $M_2$ ($V_{d2}$), −6.5 volts at the bulk node of transistor M2 ($V_{b2}$), negative three volts at the drain node of transistor $M_1$ ($V_{d1}$), −3.5 volts at the bulk node of transistor $M_1$ ($V_{b1}$), and zero volts at the source node of transistor $M_1$. The voltage 808 across the second leakage compensation circuit comprising diode $D_2$ and resistor $R_2$ is thus −2.5 volts. Resistor $R_2$ can therefore be appropriately sized to generate a corresponding compensation current less than or equal to the sum of parasitic leakage currents $i_{gidl}$ and $i_{gisl}$ so that only a small or no error current flows into or out of the bulk node of transistor $M_1$.

Figure 9A:
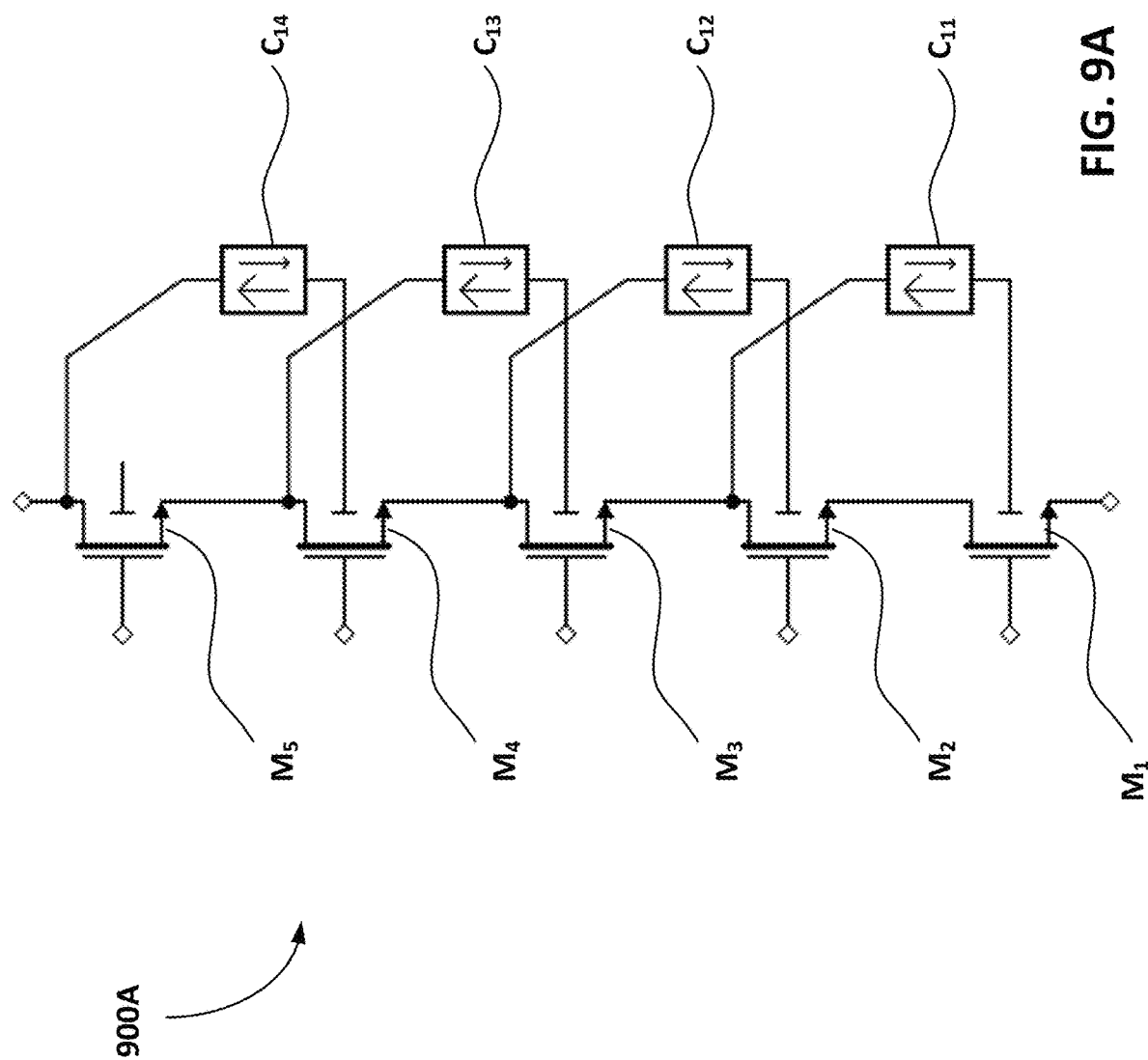

FIGS. 9A and 9B are circuit diagrams of another embodiment RF switch arrangement including a multiplicity of transistors, and including a corresponding multiplicity of leakage current compensation circuits. In FIGS. 9A and 9B the biasing circuitry is not shown for clarity, but would typically be included in a normal operating configuration.

FIG. 9A illustrates an RF switch arrangement 900A comprising a plurality of transistors $M_1$, $M_2$, $M_3$, $M_4$, and $M_5$ coupled in series between source and drain and a corresponding plurality of compensation networks $C_{11}$, $C_{12}$, $C_{13}$, and $C_{14}$ coupled between the body terminal of respective transistors in the RF stack and the drain terminal of the adjacent transistors in RF stack. In FIG. 9A, any number of transistors can be used. The drain node of transistor M5 can be coupled to an RF voltage source, or additional series connected transistors that are in turn coupled to an RF voltage source. Likewise, the source node of transistors M1 can be coupled to another RF voltage source or ground, or additional series connected transistors that are in turn coupled to another RF voltage source or ground. In FIG. 9A, the leakage currents flowing out of the body node of the transistors (in for example a negative half-period of the RF voltage source) flow through the corresponding compensation networks and back into the RF stack, so that the leakage currents cannot flow in the biasing circuitry (not shown in FIG. 9A) as previously described.

FIG. 9B illustrates an RF switch arrangement 900B similar to that shown in FIG. 9(a), but further comprising a plurality of anti-parallel compensation networks $C_{21}$, $C_{22}$, $C_{23}$, and $C_{24}$ coupled between the body node of respective transistors in the RF stack and the drain node of the adjacent transistors in the RF stack. In FIG. 9B, the leakage currents flowing out of the body node of the transistors (in for example a positive half-period of the RF voltage source) flow through the corresponding compensation networks and back into the RF stack, so that the leakage currents cannot flow in the biasing circuitry (not shown in FIG. 9B) as previously described. The RF switch arrangement 900B shown in FIG. 9B is thus configured for compensating leakage currents in both the half-periods of the sinusoidal or other periodic waveform of the applied RF voltage. Also, in the RF switch arrangement 900B of FIG. 9B, there is a correspondence of two leakage current circuits (one for each half-period) to each of the transistors in the RF stack. The configuration shown in FIG. 9B provides the maximum compensation effect for the generated leakage currents.

Figure 10B:
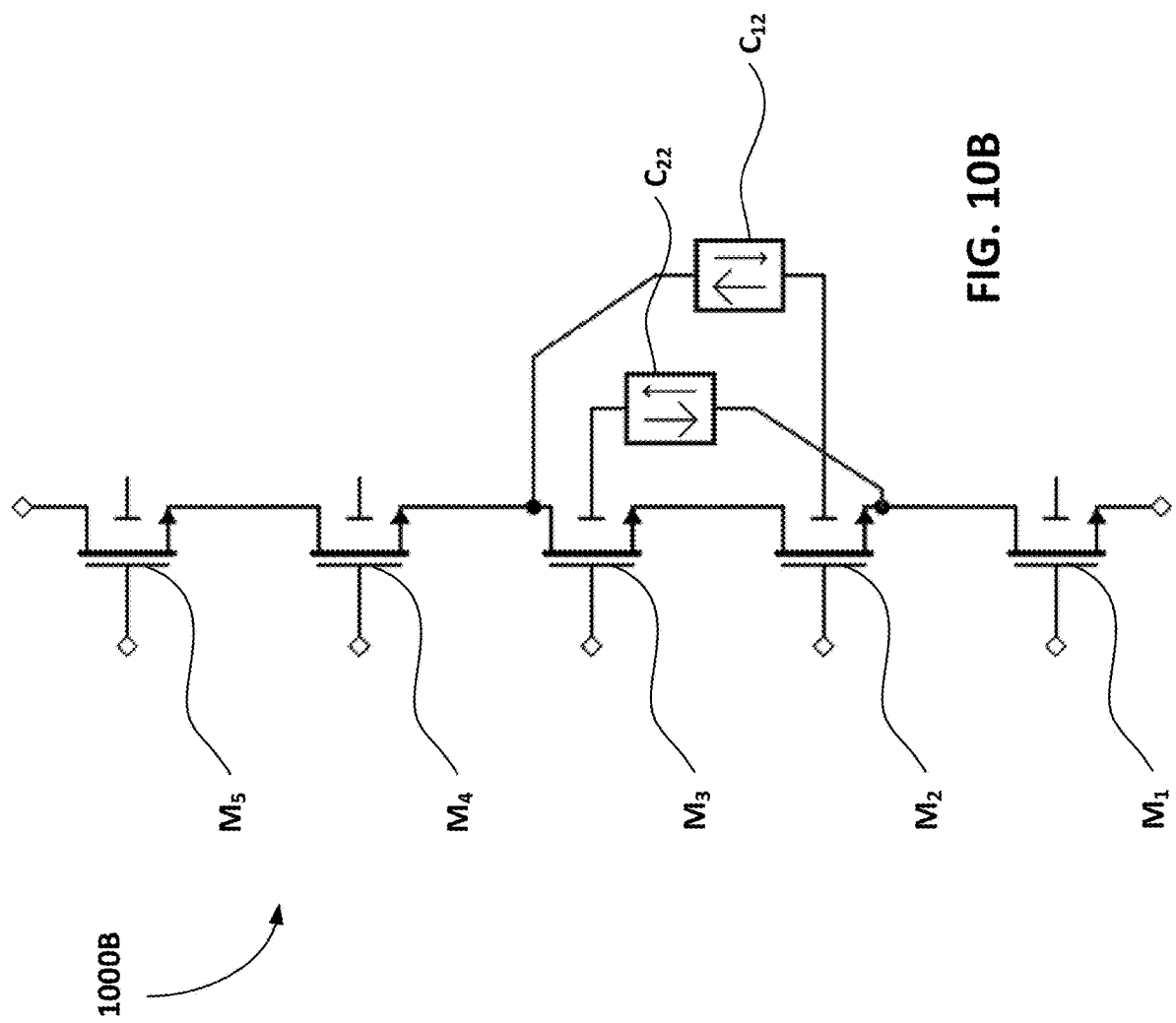
Figure 11:
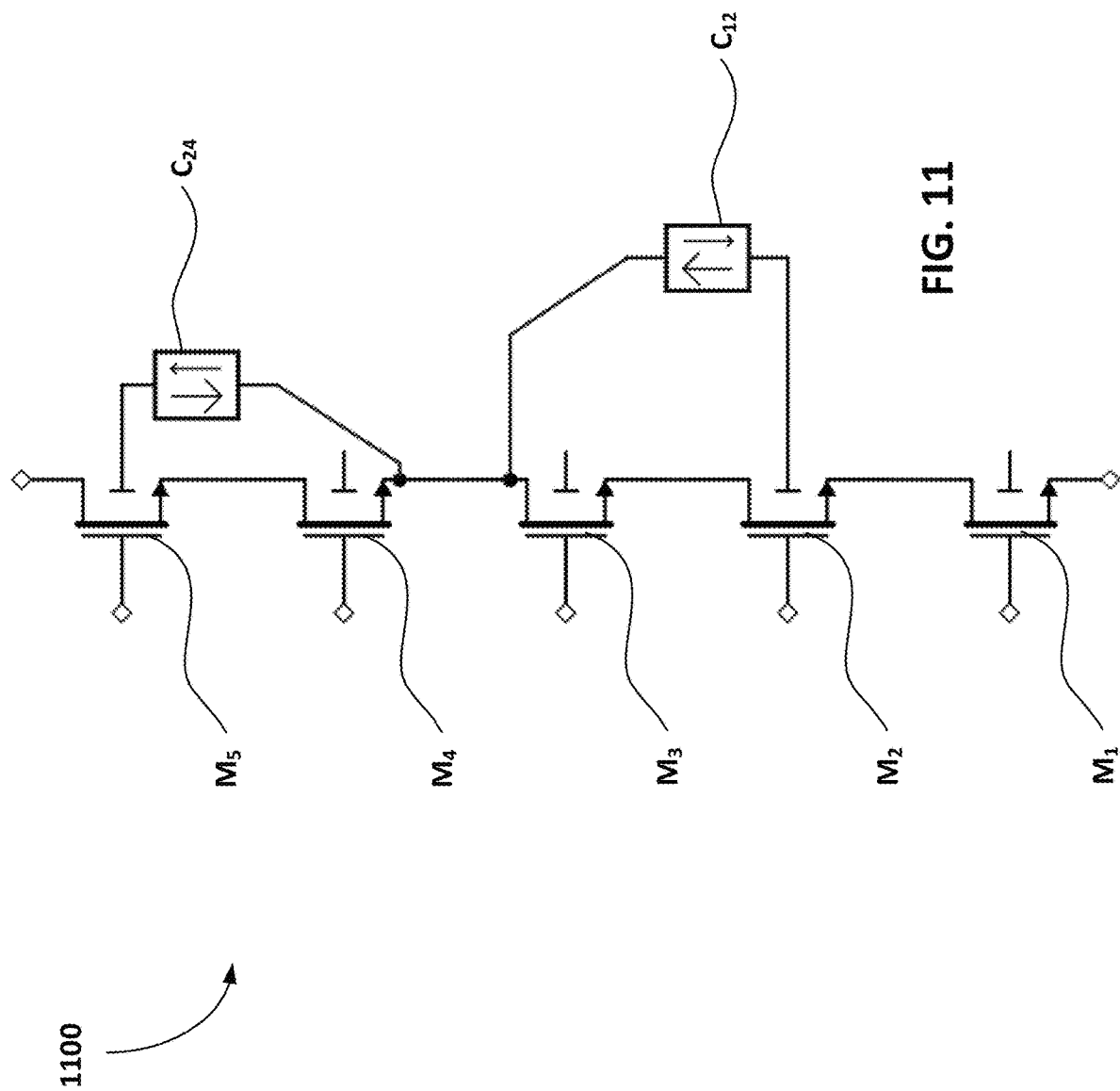

FIGS. 10A, 10B, and 11 are circuit diagrams of other embodiment RF switch arrangements including a multiplicity of transistors, and including at least one leakage current compensation circuit. As previously described, while one or two leakage current compensation circuits per transistor may provide the maximum leakage current cancellation effect in embodiments, any number of leakage current compensation circuits less than one or two leakage current compensation circuits per transistor can be used. Even one leakage current compensation circuit per RF switch will provide leakage current cancellation benefits, and corresponding improvement in maintaining bias voltages, when compared to an uncompensated RF switch. Again, while FIGS. 10A, 10B, and 11 do not include biasing circuits for clarity, biasing circuits would typically be included in a normal application.

FIG. 10A and FIG. 10B show RF switch arrangements similar to those shown in FIGS. 9A and 9B, but wherein fewer compensation networks are coupled with a subset of transistors from the same plurality of transistors in the RF switch arrangement. For example, in FIG. 10A, switch arrangement 1000A corresponds to switch arrangement 900A of FIG. 9A, with the exception that only one compensation network $C_{12}$ is used, which is coupled between the bulk node of transistor $M_2$ and the drain node of transistor $M_3$. In FIG. 10B, switch arrangement 1000B corresponds to switch arrangement 900B of FIG. 9B, with the exception that only two compensation networks $C_{12}$ and $C_{22}$ are used. Compensation network $C_{12}$ is coupled between the bulk node of transistor M2 and the drain node of transistor M3, while compensation network $C_{22}$ is coupled between the bulk node of transistor $M_3$ and the source node of transistor $M_2$. Other subsets of compensation networks can be used from the full set of compensation networks shown in FIGS. 9A and 9B. For example, while only compensation network $C_{12}$ is depicted, only compensation network $C_{11}$ or $C_{13}$ could be used. Alternatively only compensation networks $C_{11}$ and $C_{14}$, or compensation networks $C_{12}$ and $C_{13}$, could be used. Regularly repeated patterns of compensation networks, or randomly interspersed compensation networks can be used to improve the leakage current characteristics of an RF switch.

Another RF switch arrangement 1100 is shown in FIG. 11, wherein at least one first compensation network ($C_{12}$) is coupled with a subset of transistors (transistors $M_2$ and $M_3$) from the plurality of transistors in RF switch arrangement, and at least one second compensation network ($C_{24}$) is coupled with another subset of transistors (transistors $M_4$ and $M_5$) from the plurality of transistors in RF switch arrangement. Switch arrangement 1100 also generally corresponds to switch arrangement 900B of FIG. 9B, with the exception that only compensation networks $C_{12}$ and $C_{24}$ are used. Other patterns of compensation networks and corresponding subsets of transistors can be used as desired. For example, certain patterns of compensation networks may be used to accommodate constraints placed on an integrated circuit layout. While compensation networks $C_{12}$ and $C_{24}$ are shown in FIG. 11, other compensation networks can be used, for example, compensation networks $C_{11}$ and $C_{22}$, or compensation networks $C_{13}$ and $C_{22}$. Many other subsets of compensation networks can be used in FIG. 11 that are selected from the maximum number of compensation networks shown in FIG. 9B.

Figure 12:
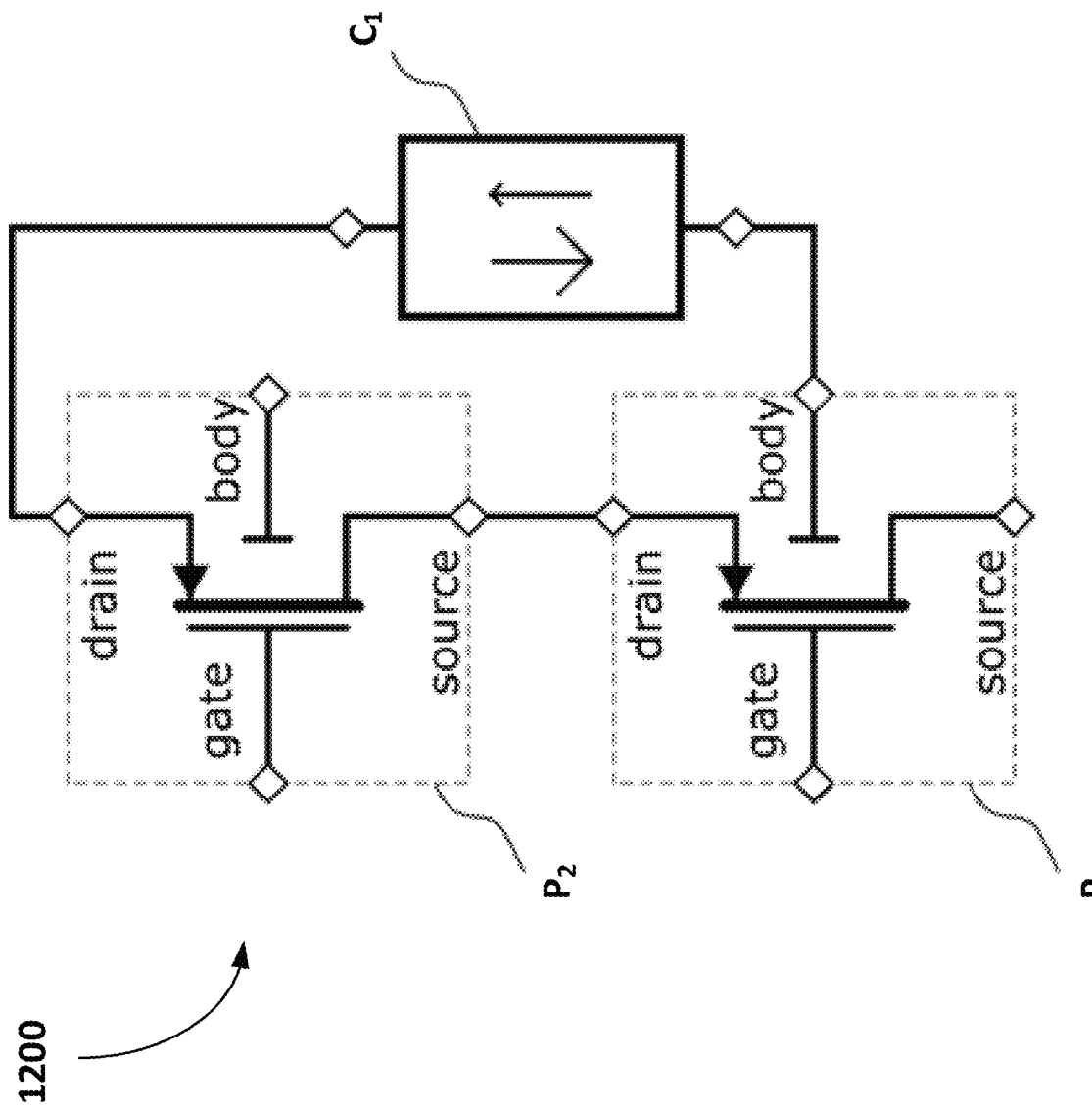
FIG. 12 is a circuit diagram of a PMOS-based RF switch arrangement including a leakage current compensation circuit, according to an embodiment.

FIG. 12 is a circuit diagram of a PMOS-based RF switch arrangement 1200 including a leakage current compensation circuit $C_1$, according to an embodiment. All embodiments described above are related to RF switch arrangements implemented with NMOS switch transistors, which is a desirable way to implement RF switches. However, if desired to accommodate a specific application, an RF switch arrangement can also be implemented with PMOS transistors. Thus, switch arrangement 1200 includes a first PMOS transistor $P_1$ and a second PMOS transistor $P_2$. The drain node of transistor $P_1$ is coupled to the source node of transistor $P_2$. Compensation network $C_1$ is coupled between the drain node of transistor $P_2$ and the body node of transistor $P_1$. The biasing network and the additional transistors, if any, in the switch arrangement 1200 are not shown in FIG. 12. The previous description of the manner of operation of compensation network $C_1$ also applies to the PMOS RF switch embodiment shown in FIG. 12, with the difference being that the compensation network polarity is reversed and the current direction is opposite. FIG. 12 thus demonstrates the implementation of a compensated RF switch using PMOS transistors.

While a bias network for an RF switch has been shown and described with respect to FIGS. 2A and 2B, various other possible arrangements of bias networks can be used, including but not limited to:

High-ohmic resistors coupled between the gate, source-drain and body nodes of respective transistors in stack and the bias DC voltages $V_g$, $V_b$, $V_s$, as shown in FIGS. 2A and 2B; high-ohmic resistors coupled between the gate, source-drain and body nodes of respective transistors in stack, forming a series chain of bias resistors tapped to bias voltages at one or multiple points along the chain, as shown below in FIG. 13; any combination of the biasing circuit arrangements shown in FIGS. 2A, 2B, and 13 used in a single high voltage RF switch; or any combination of the biasing circuit arrangements shown in FIGS. 2A, 2B, and 13 used in the single high voltage RF switch, where $V_b$ and/or $V_s$ are feedback-regulated bias voltages as described in co-pending patent application Ser. No. 15/644,435 entitled "System and Method for Biasing an RF Switch", which is hereby incorporated by reference in its entirety as though fully and completely set forth herein.

Figure 13:
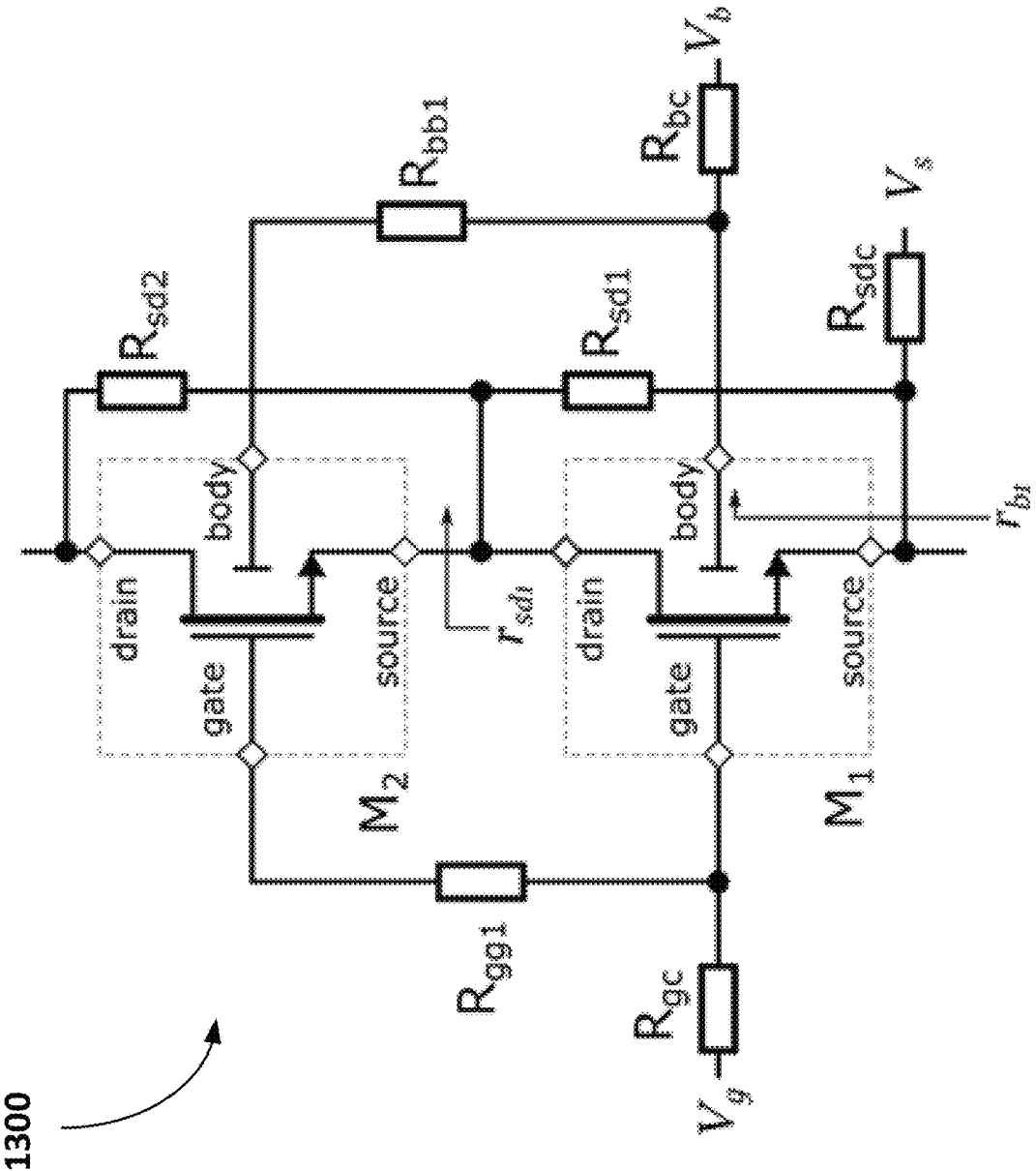
FIG. 13 is a circuit diagram of an RF switch arrangement including an alternative biasing circuit.

FIG. 13 shows an exemplary circuit portion 1300 of a high voltage RF switch including a first NMOS transistor $M_1$ in series connection with a second NMOS transistor $M_2$, and including an alternative biasing circuit. In the series connection, the source node of transistor $M_1$ is coupled to the drain node of transistor $M_2$. The drain node of transistor $M_2$ is coupled directly to an RF high voltage source, or indirectly through one or more transistors, also in series connection. The source node of transistor $M_1$ is coupled directly to ground or to another RF high voltage source, or indirectly through one or more transistors, also in series connection. The gate node of transistor $M_1$ is coupled to gate bias voltage $V_g$ through biasing resistor $R_{gc}$, and the gate node of transistor $M_2$ is coupled to gate bias voltage $V_g$ through biasing resistors $R_{gg1}$ and $R_{gc}$. The body node of transistor $M_1$ is coupled to body bias voltage $V_b$ through biasing resistor $R_{bc}$, and the body node of transistor $M_2$ is coupled to body bias voltage $V_b$ through biasing resistors and $R_{bb1}$ and $R_{bc}$. The source node of transistor $M_1$ is coupled to the $V_s$ bias voltage through resistor $R_{sdc}$. The source-drain node between transistors $M_1$ and $M_2$ is coupled to the $V_s$ bias voltage through resistors $R_{sd1}$ and $R_{sdc}$. The drain node of transistor $M_2$ is coupled to the $V_s$ bias voltage through resistors $R_{sd2}$, $R_{sd1}$, and $R_{sdc}$. The above-described biasing circuitry can be repeated and used for any additional series connected transistors not shown in FIG. 13. Any of the leakage current compensation circuits described herein can be used with the biasing circuit shown in FIG. 13.

Circuits using RF switches with the leakage current compensation circuits described herein have advantages over circuits using uncompensated RF switches, including but not limited to less introduced signal distortion, achieving good performance at higher operating voltages, as well as better reliability due to the avoidance of "hot spots" within the RF switch due to excessive local voltages across individual switch transistors, and a better overall attainment of designed operating conditions despite the presence of leakage currents.

While matching leakage currents in RF switch transistors with an equivalent compensation current generated by a leakage current compensation circuit is desirable as described herein, overcompensating or undercompensating those leakage currents with the leakage current compensation circuit will still provide benefits when compared to an uncompensated RF switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) switch device comprising:
    a first transistor and a second transistor, wherein the first and second transistors are coupled in series at a first source/drain terminal of the second transistor to establish a switchable RF path; and
    a first compensation network directly coupled between a body terminal of the first transistor and a second source/drain terminal of the second transistor,
    wherein the first compensation network is configured to establish a path for current flowing between the body terminal of the first transistor and the second source/drain terminal of the second transistor in a first direction and to block current flowing therebetween in a second direction opposite to the first direction.

2. The RF switch device of claim 1, wherein the current flowing in the first direction is configured to be less than or equal to a leakage current associated with the body terminal of the first transistor.

3. The RF switch device of claim 1, wherein a leakage current associated with the body terminal of the first transistor comprises a gate-induced source leakage current or a gate-induced drain leakage current.

4. The RF switch device of claim 1, wherein the first compensation network comprises a diode circuit.

5. The RF switch device of claim 4, wherein the diode circuit comprises a diode or a plurality of diodes coupled in series.

6. The RF switch device of claim 1, wherein the first compensation network comprises a diode-connected transistor circuit.

7. The RF switch device of claim 6, wherein the diode-connected transistor circuit comprises:
    a diode-connected transistor; a diode-connected transistor coupled in series with a resistor; a diode-connected transistor having a resistor coupled between a drain terminal and a gate terminal of the diode-connected transistor; or a diode-connected transistor having a first resistor coupled between a drain terminal and a gate terminal of the diode-connected transistor, and a second resistor coupled in series with a source terminal of the diode-connected transistor.

8. The RF switch device of claim 1, further comprising a third transistor interposed between the first and second transistors.

9. The RF switch device of claim 1, further comprising a second compensation network coupled between the body terminal of the second transistor and a source/drain terminal of the first transistor.

10. The RF switch device of claim 9, wherein the second compensation network comprises a rectifying element.

11. The RF switch device of claim 9, wherein the current flowing through the second compensation network is configured to be less than or equal to a leakage current associated with the body terminal of the second transistor.

12. A radio frequency (RF) switch device comprising:
    a plurality of transistors in series connection forming a switchable current path; and
    a plurality of first compensation networks directly coupled between a body terminal of an Nth transistor of the plurality of transistors and a drain terminal of an (N+1)th transistor of the plurality of transistors,
    wherein each of the first compensation networks comprises a rectifying element, wherein the series connection is formed between a source terminal of the (N+1)th transistor and a drain terminal of the Nth transistor, and wherein N is a positive integer.

13. The RF switch device of claim 12, wherein the plurality of first compensation networks is less than the plurality of transistors.

14. The RF switch device of claim 12, further comprising a plurality of second compensation networks coupled between a body terminal of an (M+1)th transistor of the plurality of transistors and a source terminal of an Mth transistor of the plurality of transistors,
    wherein each of the second compensation networks comprises a rectifying element, and wherein M is a positive integer.

15. The RF switch device of claim 14, wherein the plurality of second compensation networks is less than the plurality of transistors.

16. A method of compensating a radio frequency (RF) switch device comprising a first transistor and a second transistor forming a switchable current path, the method comprising causing a first compensation current to flow directly between a body terminal of the first transistor and a drain terminal of the second transistor in a first direction and blocking current flowing therebetween in a second direction opposite to the first direction.

17. The method of claim 16, further comprising generating a second compensation current between a body terminal of the second transistor and a source terminal of the first transistor in a first direction and blocking current flowing therebetween in a second direction opposite to the first direction.

18. The method of claim 17, further comprising applying an alternating voltage signal to the RF switch.

19. The method of claim 18, wherein the first compensation current is generated during a first half-period of the applied alternating voltage signal, and the second compensation current is generated during a second half-period of the applied alternating voltage signal.

20. The method of claim 19, wherein the first compensation current is less than or equal to a leakage current at the body terminal of the first transistor, and wherein the second compensation current is less than or equal to a leakage current at the body terminal of the second transistor.

21. A radio frequency (RF) switch device comprising:
a first transistor and a second transistor, wherein the first and second transistors are coupled in series at a common node to establish a switchable RF path between a load terminal of the second transistor and a load terminal of the first transistor; and
a compensation network directly coupled between a body terminal of the first transistor and the load terminal of the second transistor,
wherein the compensation network is configured to establish a path for current flowing between the body terminal of the first transistor and the load terminal of the second transistor in a first direction and to block current flowing therebetween in a second direction opposite to the first direction.

* * * * *